(12) United States Patent
O'Brien et al.

(10) Patent No.: US 8,611,460 B2
(45) Date of Patent: Dec. 17, 2013

(54) WIRELESS COMMUNICATION UNIT, INTEGRATED CIRCUIT AND METHOD OF POWER CONTROL OF A POWER AMPLIFIER THEREFOR

(75) Inventors: Michael O'Brien, Youghal (IE); Patrick Pratt, Mallow (IE); Bing Xu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 111 days.

(21) Appl. No.: 13/062,958

(22) PCT Filed: Sep. 3, 2008

(86) PCT No.: PCT/IB2008/053564
§ 371 (c)(1),
(2), (4) Date: Mar. 9, 2011

(87) PCT Pub. No.: WO2010/026445
PCT Pub. Date: Mar. 11, 2010

(65) Prior Publication Data
US 2011/0261903 A1 Oct. 27, 2011

(51) Int. Cl.
*H04K 1/02* (2006.01)
(52) U.S. Cl.
USPC ........... 375/297; 375/296; 375/295; 375/316; 455/114.2; 455/114.3; 455/91
(58) Field of Classification Search
USPC ............... 375/297, 296, 295, 316; 455/114.2, 455/114.3, 91
See application file for complete search history.

(56) References Cited

U.S. PATENT DOCUMENTS

| | | | |
|---|---|---|---|
| 7,203,247 B2 | 4/2007 | Bauder et al. | |
| 7,333,557 B2 | 2/2008 | Rashev et al. | |
| 2002/0050372 A1* | 5/2002 | Lee | 174/35 R |
| 2006/0091950 A1 | 5/2006 | Hayase | |
| 2009/0207935 A1* | 8/2009 | Behzad | 375/296 |

FOREIGN PATENT DOCUMENTS

| | | |
|---|---|---|
| EP | 1335489 A | 8/2003 |
| EP | 1570571 B1 | 2/2007 |

OTHER PUBLICATIONS

International Search Report and Written Opinion correlating to PCT/IB2008/053564 dated Jun. 24, 2009.

* cited by examiner

*Primary Examiner* — Zewdu Kassa

(57) ABSTRACT

A wireless communication unit comprises a transmitter having a forward path comprising a power amplifier, PA, and a feedback path operably coupled to the power amplifier, wherein the feedback path comprises a coupler arranged to feed back a portion of a signal to be transmitted and a controller logic module arranged to control a power control value of the power amplifier, such that the forward path and feedback path form a closed loop power control. The controller logic module is arranged to determine a gain variation in the transmitter and provide attenuation to a transmit signal passing therethrough on a transmit slot by transmit slot basis and instruct a power backoff where necessary.

20 Claims, 6 Drawing Sheets

300

(a). $G_\Delta = 0$ (b). $G_\Delta < 0$ (c). $G_\Delta > 0$ (d). $G_\Delta > 0$

WIRELESS COMMUNICATION UNIT, INTEGRATED CIRCUIT AND METHOD OF POWER CONTROL OF A POWER AMPLIFIER THEREFOR

TECHNICAL FIELD

This invention relates generally to a wireless communication unit, integrated circuit and method of power control of a power amplifier therefore.

BACKGROUND

Wireless communication systems, for example cellular telephony or private mobile radio communication systems, typically provide for radio telecommunication links to be arranged between a plurality of base transceiver stations (BTS), referred to as Node Bs with regard to a universal mobile telecommunication system (UMTS), and a plurality of subscriber units, often referred to as user equipment (UE) in UMTS.

In a cellular network, such as UMTS, the power transmitted by a UE is regulated in order to minimise interference with other UEs. Typically, the output power generated by the radio frequency (RF) power amplifier (PA) in the UE will vary due to any number, or combination, of factors, such as the manufacturing process, operating temperature, supply voltage, antenna loading and other such factors. Thus, it often becomes necessary to measure the radio frequency transmit power at, or after, the PA output and to control the PA input, typically by controlling the gain of amplifiers located earlier in the amplifier chain, in response to this measurement. This feedback will allow power control regulation to compensate for variations in PA supply voltage, operating temperature & manufacturing process.

In addition, continuing pressure on the limited spectrum available for radio communication systems is forcing the development of spectrally-efficient linear modulation schemes. Since the envelopes of a number of these linear modulation schemes fluctuate, intermodulation products can be generated in the non-linear radio frequency power amplifier. Thus, it is important to ensure any unwanted terms arising from the intermodulation are minimised and stay below a specified value. By modifying the bias to improve efficiency the PA becomes more non-linear, which in turn would lead to increased intermodulation problems. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions. It is also known that non-linearities may create in-band distortion, which is typically measured by determining an error vector magnitude (EVM). Quantum processes within a typical RF amplifying device are inherently non-linear by nature. Only when a small portion of the consumed DC power is transformed into RF power, can the transfer of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Furthermore, the emphasis in portable (subscriber) equipment is to increase battery life time. The emphasis for base station designers is to reduce power consumption, size, power dissipation, etc in order to reduce operating and equipment cost.

Hence, such operating efficiencies of the amplifiers used must be maximised. Thus, to achieve both linearity and efficiency, so called linearisation techniques are used to improve the linearity of the more efficient amplifier classes, for example class 'AB', 'B' or 'C' amplifiers. A number of linearising techniques exist, such as Cartesian Feedback, Feed-forward, and Adaptive Pre-distortion (APD) and these are often used to resolve the inherent trade off of linearity versus efficiency in wireless communication units.

One advantage of APD is that it offers excellent linearisation performance for a nonlinear, and consequently highly efficient, PA. One key feature for successful operation of APD is that off-line firmware (i.e. outside of the direct transmit path) is able to produce a reasonable starting estimation for the programmable gains of the APD loop, for example for the front-end digital domain logic elements and any programmable analogue attenuators that may exist.

However, it is also known that a subscriber communication unit may power up in a extreme conditions (e.g. at an extreme hot or cold temperature, or where there is a poor antenna mismatch, for example due to an object being located close to the antenna and thereby affecting the radiating field). Assuming that the firmware is phased under nominal conditions, then an extreme condition will cause the PA gain to vary significantly. Thus, the firmware then programs the variable gains in the line-up with non-optimal values.

In such extreme conditions, the transmitter loop gain may be significantly different from the pre-programmed nominal loop gain. Furthermore, in such extreme conditions, particularly with any antenna mismatch effect, any preloaded signal variable gain attenuator (SVGA) value applied at RF frequencies and digital attenuator (dig_attn) value applied in the digital domain of a forward path in the transmitted chain may be significantly removed from their optimal values. Here, there is an assumption in an APD system that other variable parameters, such as the gain in the receive (feedback) path hereinafter referred to as complex gain (cx_gain) values (albeit that the cx gain may be considered as real or complex values), variable gain attenuator (VGA) in a feedback path of the transmitter chain and look-up table (LUT) values used in a typical transmitter chain remain reasonably accurate. It is known that the elements in the forward path have a significant impact on the gain monitoring system. However, it is also known that the elements in the feedback path have an impact on any power accuracy and power backoff operation.

One consequence of the initial programming of non-optimal values is that any constant gain tracking (CGT) loop that is employed in the transmit chain may either hit a ceiling or a noise floor (depending on the type of gain variation). In such a case, if the SVGA and/or dig_attn value(s) is/are chosen to be too large, the CGT loop drives the digital signal into the noise floor, thereby causing signal-to-noise ratio (SNR) data recovery problems in the receiving communication unit. However, if the SVGA and/or dig_attn value(s) is/are chosen to be too small, the CGT loop drives the digital signal too high, thereby causing headroom problems, in that the signal to be transmitted is too close to its maximum level before exhibiting undesirable characteristics.

Following on from this, the APD loop can also act inappropriately, thereby causing the system to chronically fail in any one or more of the following standard's specifications: inaccurate power levelling, Adjacent Channel Power Ratio (ACPR), switching Output Radio Frequency Spectrum (ORFS), Adjacent Channel Leakage Ratio (ACLR), transient ACLR, and Error Vector Mean (EVM).

EP1570571 B1 provides one expensive solution to address the aforementioned problem, where any gain modification in a transmitter is effectively performed in the radio frequency (RF) domain, and complex initial calibration of the gain variation is required.

SUMMARY OF THE INVENTION

A wireless communication unit, an integrated circuit and a method of performing power control in a transmitter are described, as defined in the accompanying Claims.

Further aspects and features of the invention are as defined in the accompanying dependent Claims and are disclosed in the embodiments of the invention to be described.

BRIEF DESCRIPTION OF THE DRAWINGS

The accompanying figures, where like reference numerals refer to identical or logically similar elements throughout the separate views and which together with the detailed description below are incorporated in and form part of the specification, serve to further illustrate various embodiments and to explain various principles and advantages of the invention.

DESCRIPTION OF EMBODIMENTS OF THE INVENTION

Figure 1:
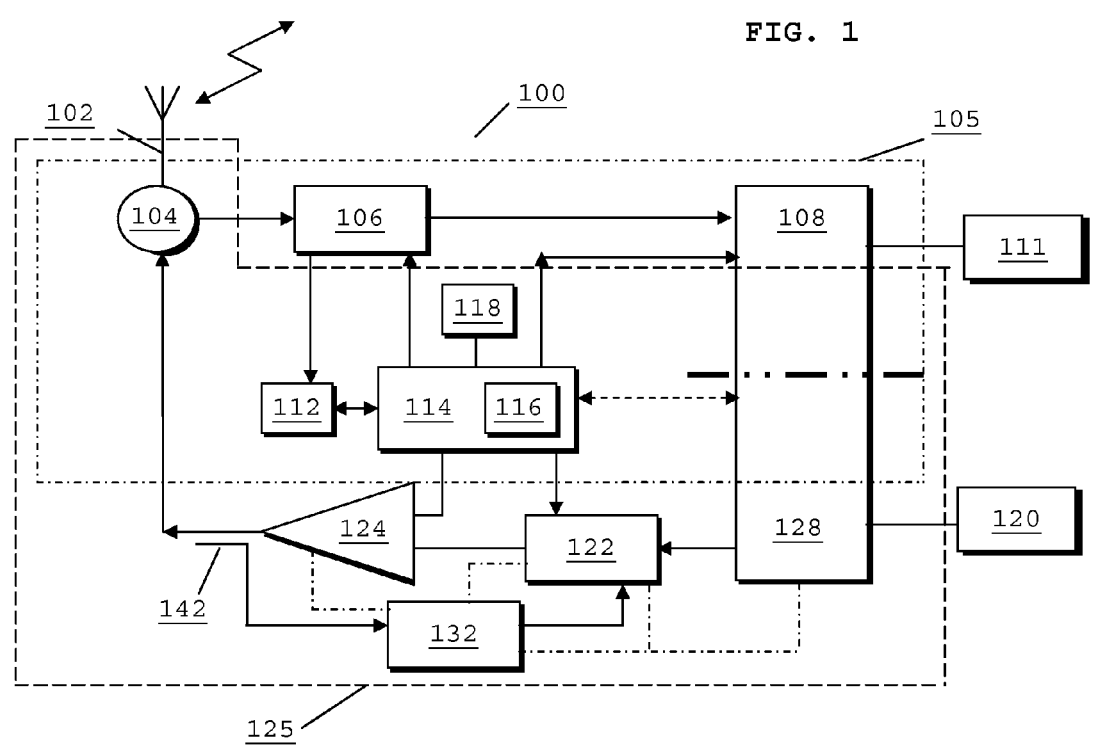
FIG. 1 illustrates an example of a block diagram of a wireless communication unit.

Before describing in detail examples of embodiments of the invention, it should be observed the apparatus components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

Generally speaking, the various embodiments provide a transmitter architecture that comprises a new arrangement and method for a transmitter to monitor a gain of a PA from transmit slot to transmit slot, based on an operation of either or both an automatic output power control (AOC) loop system and an Adaptive Predistortion (APD) system. In the context of the present invention, a transmit slot may be considered as encompassing a duration of time that the transceiver is transmitting a packet of data. After the transmit slot has completed, a transmit power change may occur and a new transmit slot can occur at the new power.

In one embodiment of the invention, the transmitter arrangement performs the gain adjustments to the line-up in both digital and analogue domains to compensate for any identified gain variation. However, it is envisaged that the techniques employed may be used to adjust a transmitter gain value in either of the digital and analogue domains.

Furthermore, the proposed transmitter architecture may, in some embodiments, solve a number of problems and/or provide a number of advantages over the known prior art.

Referring now to FIG. 1, a block diagram of an example of a wireless communication unit 100, is illustrated. For the sake of clarity, the wireless communication unit 100 is shown as divided into two distinct portions: a receiver chain 105 and a transmitter chain 125. The wireless communication unit 100 contains an antenna 102. The antenna 102 is coupled to an antenna switch 104 that provides signal control of radio frequency (RF) signals in the wireless communication unit 100, as well as isolation between the receiver chain 105 and transmitter chain 125. Clearly, the antenna switch 104 may be replaced in some embodiments of the invention with a duplex filter, for frequency duplex communication units as is known to those skilled in the art. For completeness, the receiver 105 of the wireless communication unit 100 will be briefly described. The receiver 105 includes a receiver front-end circuit 106 (effectively providing reception, filtering and intermediate or base-band frequency conversion). The front-end circuit 106 is serially coupled to a signal processing logic module (generally realised by at least one digital signal processor (DSP)) 108. An output from the at least one digital signal processor logic module 108 is provided to a user interface 111, which in a receiving context may comprise a suitable output device, such as a screen or loudspeaker. A controller logic module 114 is operably coupled to the front-end circuit 106. A memory device 116 stores a wide array of data, such as decoding/encoding logic modules and the like. A timer 118 is operably coupled to the controller logic module 114 to control the timing of operations, namely the transmission or reception of time-dependent signals.

As regards the transmit chain 125, this includes an input device 120, such as a keypad, or microphone operably coupled to signal processing logic 128 and transmitter/modulation circuitry 122 and an up-converter/power amplifier 124. A skilled artisan will appreciate that the signal processing logic module 128 in the transmit chain may be implemented as distinct from the at least one digital signal processor 108 in the receive chain. Alternatively, a single processor may be used to implement processing of both transmit and receive signals, as shown in FIG. 1.

As described hereafter, the signal processing logic module 128, transmitter/modulation circuitry 122 and the up-converter/power amplifier 124 are operationally responsive to the controller logic module 114, with an output from the power amplifier 124 coupled to the antenna switch 104. A feedback circuit includes a detector (not shown) and down-converter 132, which together with the transmitter/modulation circuitry 122, power amplifier (PA) 124 and a directional coupler 142, forms a closed feedback loop.

In transmitter RF PAs significant changes in operating conditions cause a consequential change in the PA gain. For a variety of reasons, this change in gain may result in poor operation of the transmitter's Automatic Output power Control (AOC) loop systems and particularly transmitter systems that employ Adaptive Predistortion (APD) techniques, and are thus sensitive to changes in operating conditions.

Figure 2:
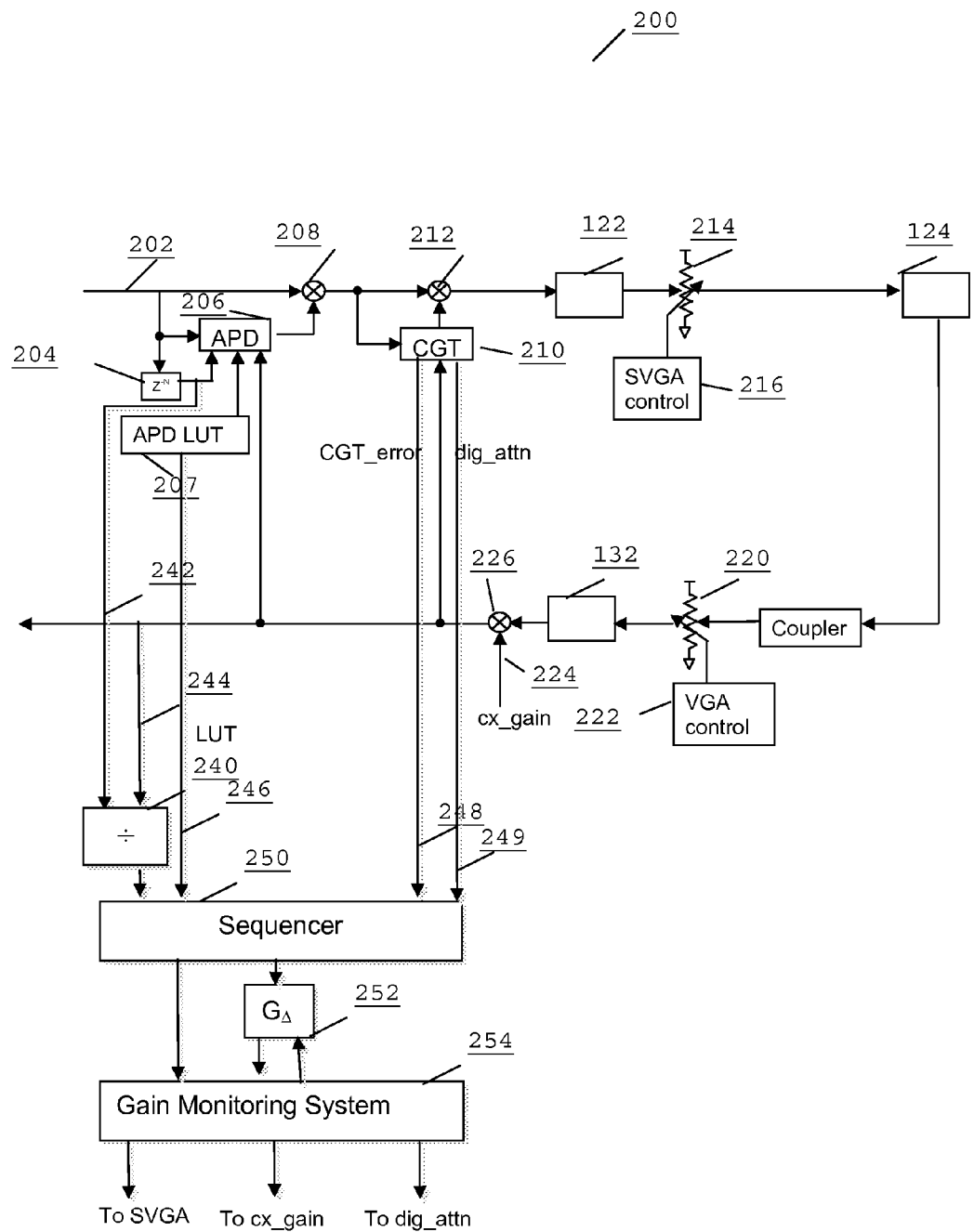
FIG. 2 illustrates an example of a block diagram implementing an adaptive predistortion (APD) and constant gain tracking (CGT) system.

Referring now to FIG. 2, an example of a block diagram of a transmitter 200 illustrates an adaptive predistortion (APD) system that incorporates constant gain tracking (CGT). The example of a block diagram of a transmitter 200 comprises a forward path receiving an input digital signal 202 that is input to a first summing/mixing logic module 208. The input digital signal 202 is also sampled and input to an adaptive predistortion (APD) logic module 206. The sampled input digital signal 202 is also input to controllable delay logic module 204, where the sampled input digital signal 202 is delayed and input to the APD logic module 206. The APD logic module 206 is also operably coupled to an APD look-up table 207 to access stored APD parameters. The APD logic module 206 is also arranged to receive a signal that is fed back from the PA. The APD logic module 206 accesses the APD look-up table 207 in order to select a parameter that closely represents the observed non-linearity through the transmitter loop. In addition, the APD look-up table is also accessible 248 by sequencer logic module 250. The output signal from the APD logic module 206 is then input to the first summing/mixing logic module 208 for multiplying with the input digital signal 202. The output signal from the APD logic module 206 is arranged to predistort the input digital signal 202, such that the ultimate signal output from the PA is in a linear form.

The digital signal output from the first summing/mixing logic module 208 is also sampled and input to a constant gain tracking (CGT) logic module 210. The CGT logic module 210 is also operably coupled to receive a signal that is fed back from the PA. The output from the CGT logic module 210 and the output from the first summing/mixing logic module 208 are input to a second summing/mixing logic module 212. The CGT logic module 210 is arranged to provide a digital multiplicative term (hereinafter referred to as dig_attn) value to the signal to be transmitted in the particular transmit slot. The CGT logic module 210 is initially loaded with a dig_attn value and is then arranged to monitor both the output of first summing/mixing logic module 208 and the output of third summing/mixing logic module 226 and adjusts dig_attn accordingly. Hence, if the starting value of dig_attn is poorly chosen, the CGT updates it naturally.

The output from the second summing/mixing logic module 212 is input to transmitter/modulation circuitry 122 that may comprise digital-to-analogue converter, baseband to RF frequency conversion circuitry and an I-Q modulator logic module, as known. The output from the transmitter/modulation circuitry 122 is input to a RF variable gain attenuator (VGA) 214, which is under control of SVGA control logic module 216. In an example of a embodiment, SVGA control logic module 216 forms part of the controller 114 of FIG. 1. The SVGA control logic module 216 is arranged to select an attenuator level that provides an optimal trade-off between signal headroom and signal to noise ratio (SNR) in a digital domain for a given target power.

In order to achieve a specific target power, the only two variables that can be tuned to influence the target power comprise the digital attenuator (referred to as dig_attn) and the SVGA gain (where different analogue gains can be selected from a digital control word). Thus, selecting a specific SVGA gain becomes a tradeoff between SNR (where the digital attenuator is at its lowest level resulting from the SVGA gain being too large) and headroom (where the SVGA gain is chosen too small and the digital attenuator must increase unacceptably to reach the required target power). The output from the RF variable gain attenuator (VGA) 214 is input to a power amplifier circuit 124, which comprises a balun, a transmission line, and a power amplifier device to support use of a feedback path, as known.

The power amplifier circuit 124 provides a coupled portion of the transmitted signal into a feedback path that comprises a feedback RF variable gain attenuator (VGA) 220, which is under control of VGA control logic module 222. In an example of a embodiment, VGA control logic module 222 forms part of the controller 114 of FIG. 1. The VGA control logic module 222 is arranged to select an attenuator level that provides an optimal trade-off between signal headroom and signal to noise ratio (SNR) in the feedback path.

The output from the RF VGA 220 is input to a feedback circuit 132 that includes a detector, down-converter and an analogue-to-digital converter. The output from the feedback circuit 132 is input to a third summing/mixing logic module 226, which multiplies the fed back digital signal with a complex gain (cx_gain) value 224. The cx_gain value 224 is selected, say by controller 114 of FIG. 1, to specify a specific target power that is reached.

In the described example of a embodiment, the cx_gain parameter is specific to both the APD system and the CGT system and is used for power control. What the APD will try to do is align the signals 202 and the output of the third summing/mixing logic module 226. If those two signals are aligned then it means that the APD system is working well. To utilise the full range of the LUT, the reference signal at 202 could probably use the entire digital range, which is why the scaling for power control is not on the feedforward path. Hence, power control scaling is included in the feedback path (which, ignoring SNR & headroom issues, is mathematically equivalent to having the scaling in the feedforward path from an AOC perspective).

The output from the third summing/mixing logic module 226 is then provided to the remaining portions of the feedback arrangement, including providing the fed back inputs to CGT logic module 210 and APD logic module 206 as mentioned earlier.

A number of transmitter parameters can be loaded in advance, so that an acceptable performance can be achieved from switching on the APD system. These parameters can then be fine-tuned to achieve optimal performance. For example, parameters that may be pre-loaded comprise:

(i) a digital-domain attenuator arranged to provide attenuation to a transmit signal passing therethrough on a transmit slot by transmit slot basis, referred to hereinafter as slot or dig_attn. This attenuator may be located at a starting point for the digital domain and is the starting point for the constant gain tracking (CGT) loop. Firmware within the controller logic module 114, comprises a model of the complete transceiver system at all power targets. For each transmit slot, the VGA and the cx_gain values are fixed, and these remain constant at all operating powers. Next, the SVGA value is loaded (which may be modified later within the transmit slot, if required). Next, the dig_attn and the LUT are loaded, based on the parameters contained in the firmware in the controller logic module 114. The APD loop and the CGT loop switch on and the operation of these loops modify the dig_attn and the LUT entries respectively, if required and as described below. If the firmware model is accurate then, in principle, the dig_attn and the LUT should not deviate from their pre-loaded values and thus the transceiver model in the firmware is accurate. However, if the dig_attn and the LUT entries do deviate significantly from their starting values, then it is understood that the firmware model is inaccurate and a gain estimate modification is required.

(ii) a signal variable gain attenuator (SVGA) index, which is arranged to maximise the trade-off between SNR and allowable headroom. In practice, a very fine adjustment is achievable with dig_attn, but only a rough adjustment is achievable with the SVGA. For example, the SVGA might be able to only change in 4 dB steps. If, for example, conditions cause the PA gain to increase by 6 dB, then the SVGA/dig_attn combined gain would have to consequently reduce by 6 dB. Thus, a good solution might be to instruct the SVGA to reduce by 4 dB and as a result, the dig_attn would only have to reduce by 2 dB.

(iii) a complex gain (cx_gain) value, which specifies the target power for the adaptive output control (AOC) loop;

(iv) a variable gain attenuator (VGA) value located in a feedback path, which is arranged to optimise the trade-off between SNR and headroom on the feedback path. Recall that the (VGA_gain)*(cx_gain) must combine to provide the required target power (so that the input signal 202 and the output of the third summing/mixing logic module 226 align). This places a restriction on what the output of the ADC 132 must be. If the VGA gain is chosen too large then the ADC will saturate (and selecting a value of cx_gain will not improve this). If the VGA gain is chosen too small then the output of the ADC 132 will be in the noise floor and the cx_gain will have to increase to an unacceptable level; and (v) look-up table (LUT) entries 207 for the APD system, that are accessible by a controller and used to set parameters in the transmitter system. In particular, the LUT entries are arranged to ensure that wireless communication is tuned based on nominal conditions (e.g. room temperature and nominal load). Further, the LUT entries are used to specify a register (GA) 252 that contains a running estimation of the gain variation from the nominal.

It is worth highlighting that prior to any radio transmission, a phasing exercise has to be done, where a unique combination of the VGA gain and the cx_gain are selected per target power and saved into RAM in firmware. If a specific power target is instructed (probably by the basestation), then the firmware will be notified of this. The firmware then selects a specific cx_gain and VGA setting, dependent upon this power target, and loads these settings into the transmitter for accurate power transmission.

For any given transmit slot, the SVGA and dig_attn values are arranged to be updated from this register G$\Delta$, for that slot. Further, the update process comprises measuring the running estimation of the gain variation (GA) on a transmit slot-by-transmit slot basis.

In one embodiment, it is envisaged that the gain monitoring adjustment may be performed in any of three different times during a slot:

(i) after aoc_step is applied at 202, which requires monitoring of signals 242 and 244, (ii) at the end of APD operation, which requires monitoring of signal 246, (iii) at the end of CGT operation, which requires monitoring of signals 248 and 249.

The sequencer logic module 250 determines if one of these time instants has occurred and instructs the Gain Monitoring logic module 254 to evaluate the gain variation and accumulate it to G$\Delta$ 252, depending upon what type of gain adjustment is appropriate. Once a G$\Delta$ update has occurred, the sequencer logic module 250 is then arranged to decide if an SVGA or dig_attn update is feasible, for example whether low power is being transmitted. If the sequencer logic module 250 decides that such an update is feasible, then the sequencer logic module 250 instructs the Gain Monitoring logic module 254 to update the SVGA and the dig_attn based on G$\Delta$. The sequencer logic module 250 is also arranged to determine whether a power backoff can be initiated. If the sequencer logic module 250 determines that a power backoff is necessary then the sequencer logic module 250 instructs the Gain Monitoring logic module 254 to update the cx_gain value accordingly.

For instance, G$\Delta$ may be arranged to be measured on the first transmit slot after power-up (specifically for wideband code division multiple access (WCDMA) signals in a WCDMA-capable wireless communication unit), and an initial gain (or attenuation) level is applied to the signal being passed to the PA based on the first transmit slot measurement. After a finite time, for example as determined by the sequencer logic module 250, the response to this step propagates through the feedback path. If dig_attn, SVGA, cx_gain, VGA and LUT entries are correctly chosen, then the magnitude of the delayed transmit signal and the magnitude of the received signal should be equal. If the magnitudes of these signals are not equal, then it is assumed that a gain offset has occurred. Approximation logic is arranged to determine an extent of the offset between the magnitude of the transmit signal and the received signal and assumes that this offset provides a good estimation of G$\Delta$.

This determination may be performed at low powers, for example as determined by the sequencer logic module 250, meaning that the SVGA and dig_attn value updates may be performed immediately, without having significant impact on transient adjacent channel leakage ratio (ACLR) performance. Instantaneous changes to the dig_attn value and even more particularly to the SVGA value may create step-like changes in the PA output power. A step like change in the PA output power, at high power levels, is likely to cause problems in meeting the output frequency spectrum specifications. For this reason, if the proposed invention deems that a gain change has occurred and the PA is still transmitting at a low target power then step-like adjustment on the SVGA and/or dig_attn is possible. Otherwise if the PA is transmitting at a large power then the gain variation must be performed at a different time.

The generic equation [1] given below can be used to estimate G$\Delta$ at the end of a CGT operation (noting that the sequencer logic module 250 may be arranged to determine when this measurement is made with signals 248 and 249 determining how the calculation is performed):

$$G_\Delta(dB) = 20\log_{10}\left(\frac{\text{dig\_attn}_{end}}{\text{dig\_attn}_{start}}\right) - 20\log_{10}(1 - \text{cgt\_error}_{end}) \quad \text{Equation [1]}$$

Where:

cgt_error$_{end}$ will only assume a significant value when the digital signal reaches a 'ceiling' level during the CGT operation, and in all other cases will be a level within the noise floor of the estimation, and therefore not contribute to the calculation of G$\Delta$. In the context of the present invention, the terms 'ceiling' and 'headroom' are used interchangeably. If, for example, the CGT operation tries to drive the DAC value above the headroom threshold, it will remain at the maximum (ceiling) and not go any further. Similarly, if the SVGA gain is selected at too small a value, then the CGT operation will attempt to increase the dig_attn to compensate for this shortfall. In effect, the CGT operation will try to increase the dig_attn gain and this will occur until the gain variation has been catered for, or until the digital ceiling has been reached (where no further digital gain is possible).

Thus, for a reasonably tuned loop, the 20 log 10(1−cgt_error$_{end}$) needs only be specified for positive errors. It is also noteworthy that this gain estimate may be used in conjunction with a power target backoff methodology, one example of a embodiment of which is described later.

The power backoff equation, for example a modification to the cx_gain value, can be derived as in equation [2]:

$$\text{cx\_gain}_{ideal} = \frac{\text{cx\_gain} * tx_{rms}}{tx_{rms} - \text{cgt\_error}_{end}} \quad \text{Equation [2]}$$

Where:

tx$_{rms}$ is the root mean square (rms) value of the transmit signal (e.g. 0.5 for a WCDMA signal);

cx_gain is the complex gain signal level received for the firmware;

cx_error$_{ideal}$ is the updated cx_gain value at the end of the CGT operation; and cgt_error$_{end}$ is the CGT error when the CGT operation is disabled.

It is envisaged that the instant that this calculation is performed, together with a decision on when the power backoff occurs, may be dictated by the sequencer logic module 250. The Gain Monitoring logic module 254 may be arranged to actually perform the calculation.

In addition, in an example of a embodiment, the following equation is met when updating both the SVGA and dig_attn values, as performed by the Gain Monitoring logic module 254:

$$SVGA\Delta dB + dig\_attn\Delta dB = G\Delta dB \quad [3]$$

Where:

SVGA$\Delta$dB equals a change in gain in dB applied to the SVGA dig_attn$\Delta$dB equals a change in gain in dB applied to the dig_attn value.

In an example of a embodiment, the SVGA value is chosen to provide an optimal trade-off between SNR and headroom dig_attn, where in one embodiment the tradeoff is performed in the Gain Monitoring logic module 254. Note that it is not necessary to update dig_attn, as the CGT will achieve this naturally. However, in an example of a embodiment, the updating of the dig_attn value can be performed by the controller, if the updating operation can be achieved relatively easily.

Thus, a gain monitoring system is described that estimates PA gain variation from its nominal value. G$\Delta$ is arranged to be estimated from any one or more of three different points, which in one embodiment are recognised by the sequencer logic module 250 as described above, in a transmit slot. G$\Delta$ is arranged to be estimated for systems that possess inherent APD and/or CGT systems. It is also envisaged, in an example of a embodiment, that the aforementioned methodology may be applied to subsets of APD and/or CGT systems.

A first measurement point may be in a region where the PA commences transmission on an arbitrary transmit slot, at low power. If it is determined that there is an amplitude discrepancy between the transmitted signal and the detected signal, by comparing signals 242 and 244, it can be attributed to a PA gain variation. At this first measurement point, the PA gain variation may be estimated and accumulated into G$_A$ in 252. As the PA is transmitting at low powers, as recognised by the sequencer logic module 250 in one embodiment, the line-up gain may be modified, as calculated by the Gain Monitoring logic module 254 in one embodiment, without having a significant impact on switching ORFS or transient ACLR performance of the transmitter.

A second measurement point may be in a region where a gain variation is estimated at the end of a CGT operation. The sequencer logic module 250 determines when this measurement is made. It is assumed that the firmware preloads the digital domain dig_attn value with the expected final value. If there is a discrepancy between the digital value at the start and finish of the CGT operation then the Gain Monitoring logic module 254 of FIG. 2, again assumes that a PA gain variation has occurred. The controller accumulates this discrepancy into the gain variation estimate in G$_A$ 252. As the PA 124 is now transmitting at high powers, as recognised by the sequencer logic module 250, it is impractical to modify the line-up gains. However, the PA gain variation may be stored to fine-tune parameter settings for subsequent transmit slots. As a result of the determination of the discrepancy between the digital value at the start and finish of the CGT operation, a power back-off may be performed, as indicated by the adjustment to the cx_gain value at the output of the Gain Monitoring logic module 254, if required, where the PA operation is adjusted, such that it transmits at a slightly lower output power.

A third measurement point may be in a region where the gain estimate is modified is at the end of the APD operation, which may be initiated by the sequencer logic module 250. The LUT entries for APD are generally normalised at one operating point (typically at a rms amplitude of the transmitted signal). If, at the end of the APD operation, the LUT entry at this operating point deviates from this normalised point, the Gain Monitoring System logic module 254 may infer that a gain variation exists. Thus, the controller may accumulate this discrepancy into the gain variation estimate G$_A$ 252.

Thus, in this manner, the aforementioned mechanisms for measuring gain variation allow the controller to maintain an optimal trade-off between headroom and a signal to Noise Ratio (SNR) in the digital domain. The controller is then able to optimise the APD and/or the CGT systems across all operating conditions. In extreme cases, when the line-up gain modification cannot be performed by the controller, the controller may implement a power back-off operation, as indicated by the cx_gain output of the Gain Monitoring logic module 254.

Figure 3:
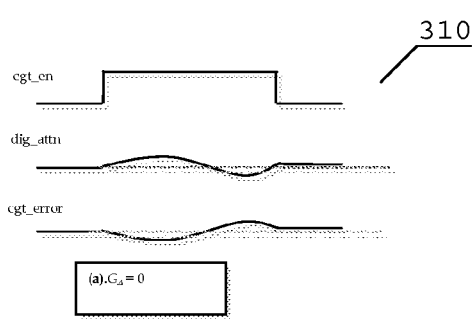
FIG. 3 illustrates an example of a set of waveforms used to determine a gain offset.
Figure 3:
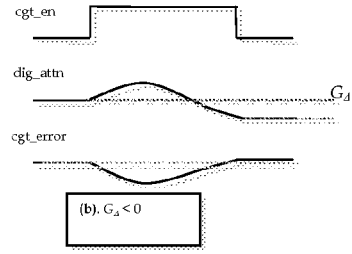
Figure 3:
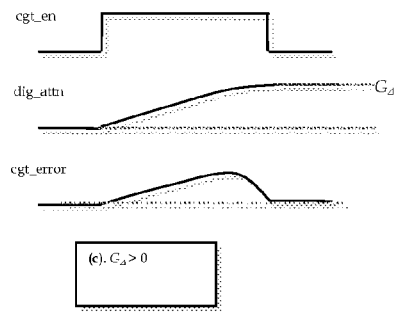
Figure 3:
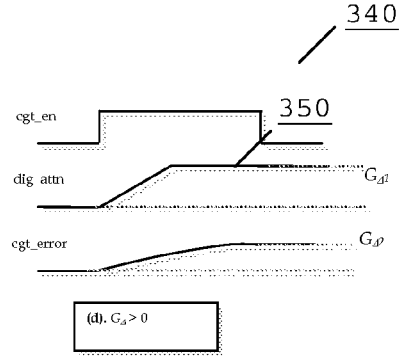

Referring now to FIG. 3, an example of a set of waveforms used to determine a gain offset is illustrated. These waveforms indicate an example of a mechanism for measuring a gain delta value (G$_A$) at the end of a CGT operation. Before a CGT operation starts, the firmware loads the dig_attn value with a value that is believed to be the optimum value. Waveforms 310 illustrate that the dig_attn value at the start of a CGT operation equals the dig_attn value at the end of the CGT operation. This implies that the correct SVGA value and dig_attn value have been applied and that no update to G$_A$ occurs.

Waveforms 320 illustrate that the dig_attn value deviates negatively from its value at the start of a CGT operation. This implies that the loop gain is larger than the firmware assumed. Thus, G$_A$ must be reduced from its stored value and reduced by the gain change in dig_attn.

Waveforms 330 illustrate that the dig_attn value deviates positively from its value at the start of a CGT operation. This implies that the loop gain is smaller than the firmware assumed. Thus, G$_A$ must be increased from its stored value and increased by the gain change in dig_attn.

Waveforms 340 also illustrate that the dig_attn value increases from its value at the start of a CGT operation. This implies that the loop gain is smaller than the firmware assumed. However a digital ceiling 350 is hit, indicating that the target power cannot be reached. Again, G$_A$ must be increased from its stored value and increased by not only the gain change in dig_attn, but also on the magnitude of the CGT error signal when the loop is opened.

Figure 4:
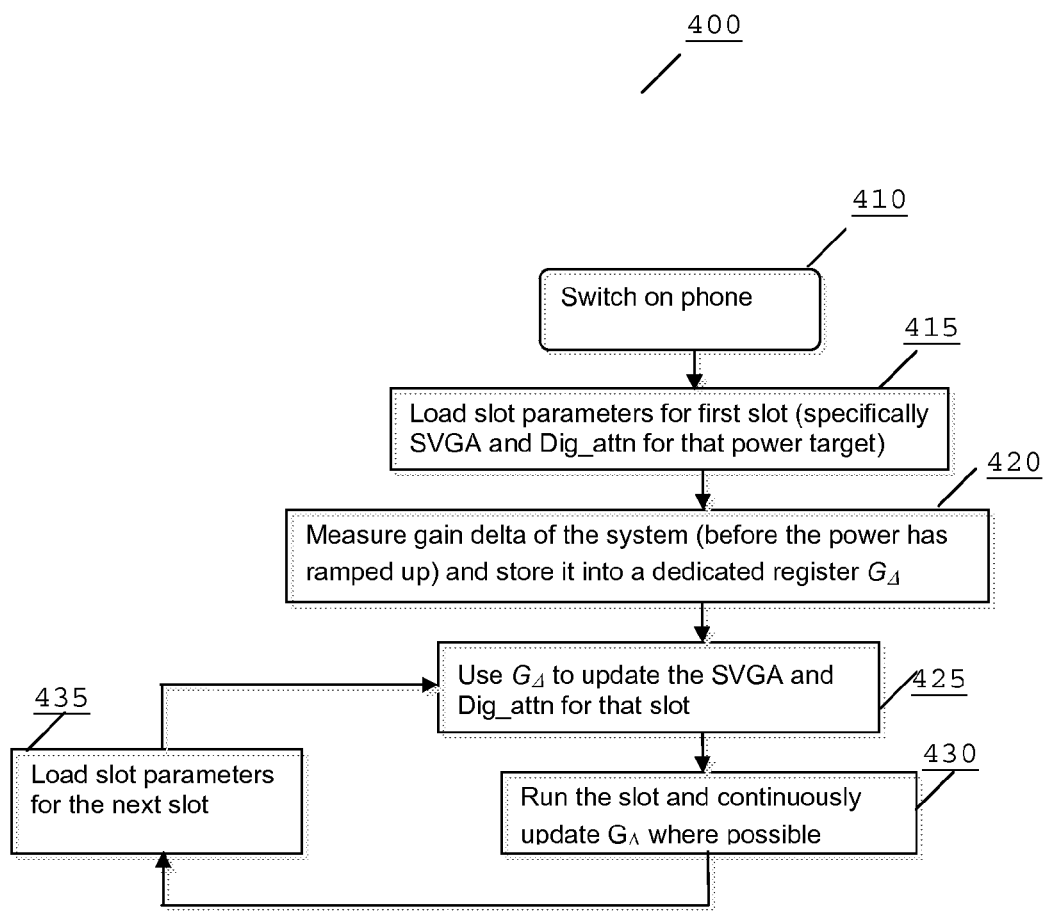
FIG. 4 illustrates an example of a flowchart of constant gain tracking adapted.

Referring now to FIG. 4, a flowchart 400 illustrates a method of constant gain tracking. The flowchart 400 commences with a wireless communication unit, such as a mobile phone, being switched on as shown in step 410. Slot parameters are then loaded for first transmit time slot (specifically SVGA and Dig_attn for that power target), as shown in step 415. A gain delta value (G$_A$) of the transmitter system is then estimated (for example before the power has ramped up) and stored in, for example, a dedicated register, as shown in step 420. The gain delta value ($G_A$) is used to update the SVGA and Dig_attn values for that transmit time slot, as shown in step 425. The transmit time slot is then run and the gain delta value ($G_A$) continuously updated, where possible, as shown in step 430. The slot parameters are then loaded for the next slot as shown in step 435.

Figure 5:
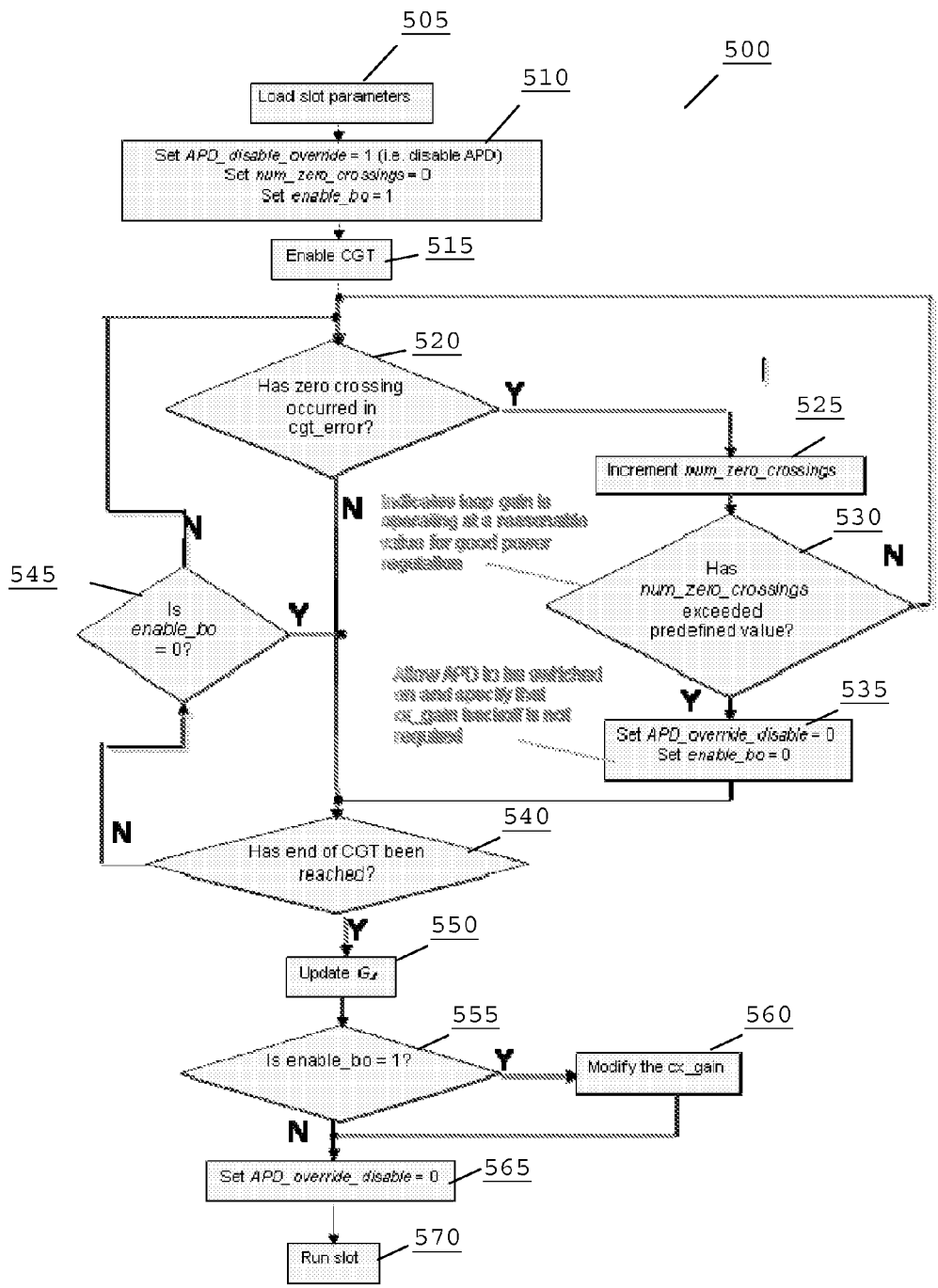
FIG. 5 illustrates an example of a flowchart of a power back-off.

Referring now to FIG. 5, a flowchart 500 illustrates a power back-off implementation. Slot parameters are loaded, as shown in step 505. Then, the ADP_disable_overide parameter is set to '1' (for example to disable APD), as shown in step 510.

In an extreme case, where $G_A$ is large, the APD system will try to compensate for an unreasonable gain variation that 'breaks' the APD system, which is often referred to as causing the APD system to diverge. Thus, the APD system cannot be enabled until it is safe to turn it on. For example, the APD can be turned on under either of two conditions: first if the CGT has converged (which is indicated by the number of times the CGT_error (in 210) has a specific number of zero crossings, in parameter 'num_zero_crossings'; or secondly after the CGT operation drives the digital signal to its maximum level (ceiling) and a power backoff has occurred Additionally, the num_zero_crossings parameter explained above, is set to a '0' value, is incremented every time that CGT_error has a zero crossing, and the enable_bo power backoff only occurs if the digital signal reaches its maximum level during the CGT operation. This implies that there is a large gain variation that the CGT operation cannot compensate for and as a result a power backoff must occur. Thus, in the default condition, power backoff is allowed (controlled using backoff en parameter) and, once the minimum number of zero crossings has been reached, then the power backoff is disabled (because it has been established that a backoff is definitely not needed).

The constant gain tracking (CGT) algorithm is enabled, as shown in step 515. A determination is then made as to whether a zero crossing has occurred in a CGT_error parameter, as shown in step 520. A num_zero_crossings parameter is then incremented, as shown in step 525. A determination is then made as to whether the num_zero_crossings parameter has exceeded a predefined value, meaning that the CGT operation has converged and no power backoff is required, as shown in step 530. An ADP_override_disable parameter is then set to a '0' value, as it is no longer necessary to disable the APD system as it is not expected to diverge, and the enable_bo parameter set to a '0' value, as shown in step 535, as power backoff is no longer required. A determination is then made as to whether the end of the CGT algorithm has been reached, as shown in step 540. A determination is then made as to whether the enable_bo (in one of the flowchart paths for example step 520 directly to step 540 and through step 545, when a zero crossing has never occurred) is equal to a '0' value, as shown in step 545.

The gain delta value ($G_A$) is then updated, as shown in step 550. If the enable_bo parameter remains set to a '1' value, as shown in step 555, the complex gain (cx_gain) value is then modified, and a power backoff occurs as shown in step 560, otherwise if the enable_bo parameter is set to '0' in step 555 then the cx_gain parameter is not modified suggesting that no power backoff is performed. Then, the ADP_disable_overide parameter is set to '0' (for example to enable APD), as shown in step 565. In one example of a embodiment, the APD disable_override is be fixed to '0', because either the CGT has converged, or a backoff has occurred, as described previously, and as the APD functionality is no longer restricted. The transmit time slot is then run, as shown in step 570.

Recall that the $G_A$ register can be updated either at: (i) low powers (whose functionality can be enabled or disabled by enable_low_power_gain_update), (ii) at the end of a CGT operation (whose functionality can be enabled/disabled by enable_CGT_gain_update), or (iii) at the end of APD (whose functionality can be enabled/disabled by enable_APD_gain_update).

Figure 6:
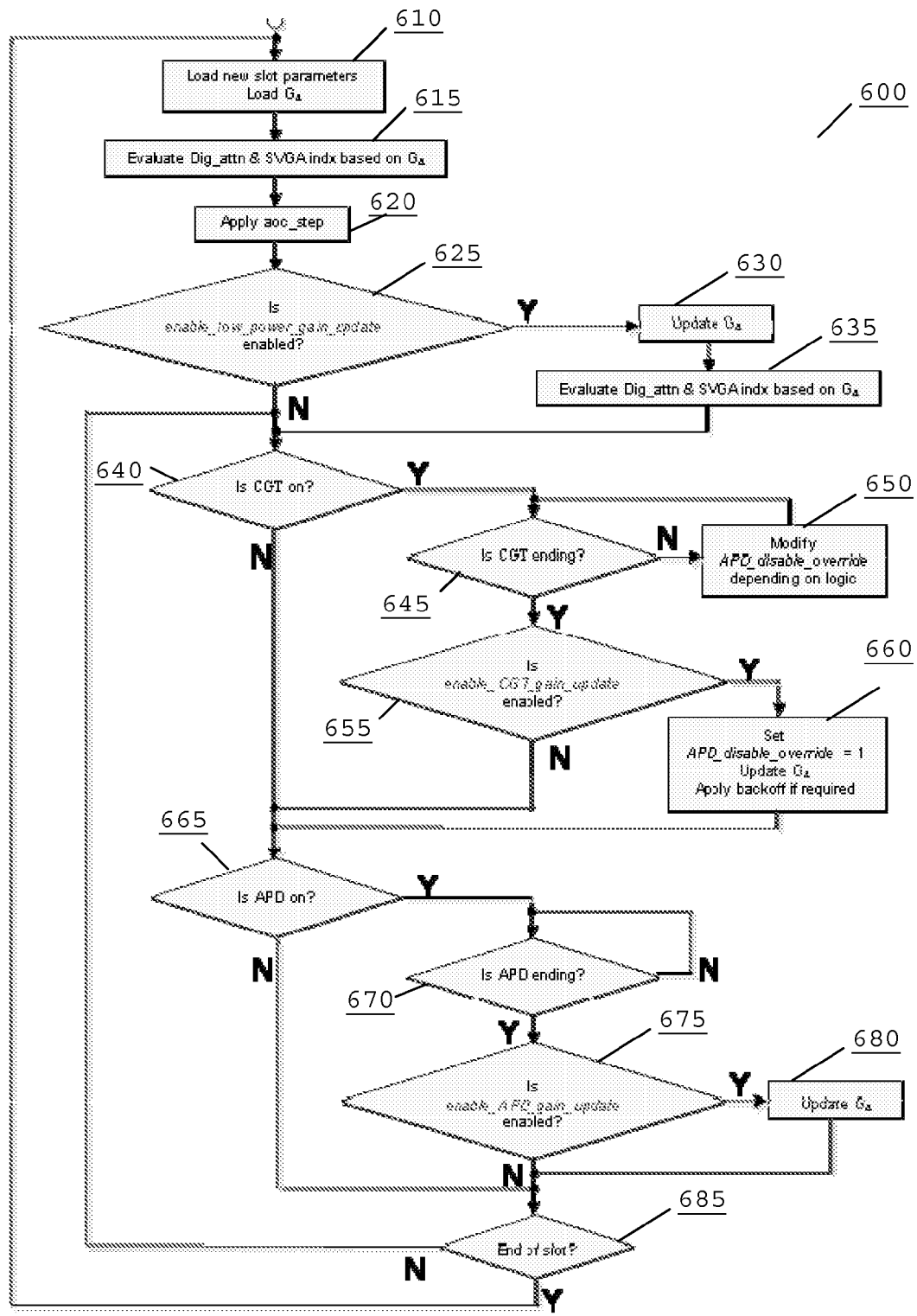
FIG. 6 illustrates an example of a flowchart of a gain monitoring implementation.

Referring now to FIG. 6, a flowchart 600 illustrates an example of a gain monitoring implementation method. The flowchart 600 commences with new transmitter parameters (e.g. dig_attn, SVGA gain, LUT entries, VGA gain & cx_gain for a given power target) for the slot being loaded, together with the gain delta value $G_A$, as shown in step 610. Thereafter, the process evaluates the dig_attn and SVGA index (values) based on $G_A$ as shown in step 615. For example, step 615 may be performed by firmware in controller logic module 114 of FIG. 1. In step 620, for a transmitter supporting an APD operation the aoc_step is applied, which equates to powering up the PA by ensuring it drives a low power output. A determination is then made as to whether the enable_low_power_gain_update parameter is enabled, as explained above and as shown in step 625. If the enable_low_power_gain_update parameter is enabled, in step 625, the gain delta value $G_A$ is updated, as shown in step 630. This update is simply the gain differential between the transmitted aoc_step (in 202 of FIG. 2) versus the resultant detected step at the output (of logic 226 of FIG. 2). The Dig_attn and SVGA index are then evaluated again, and loaded into the transceiver during a live transmit operation (acknowledging that the output power is low) based on the updated gain delta value $G_A$, as shown in step 635.

Thereafter, or if the enable_low_power_gain_update parameter is not enabled in step 625, a determination is made as to whether the constant gain tracking (CGT) operation is being performed, as shown in step 640. If it is determined that the constant gain tracking (CGT) operation is being performed in step 640, a determination is made as to whether the constant gain tracking (CGT) operation is ended, as shown in step 645. Recall that this determination is the difference between the dig_attn value at the start of a CGT operation versus the dig_attn value at the end of the CGT operation. If the constant gain tracking (CGT) operation is not ended in step 645, the ADP_disable_override parameter is modified, dependent upon the logic output (and representative of steps 515 to 540 in FIG. 5), as shown in step 650, and the process loops back to step 645.

If the constant gain tracking (CGT) operation is ended in step 645, a determination is then made as to whether the enable_CGT_gain_update parameter is enabled, as shown in step 655. If the enable_CGT_gain_update parameter is enabled in step 655, the APD_disable_override is set to equal '1' and the gain delta value $G_A$ is updated again, as shown in step 660. In addition, if required, a backoff of the PA output power (or input power to reduce the output power level) may be applied, as shown in step 660. In effect, steps 645 to 660 describe and replicate steps 540 to 565 in FIG. 5.

In response to a determination that the constant gain tracking (CGT) operation is not being performed in step 640, or that the enable_CGT_gain_update parameter is not enabled in step 655, or that the APD_disable_override parameter has been set to equal '1' and the gain delta value $G_A$ has been updated again in step 660, a determination is made as to whether the APD operation is turned 'on', as shown in step 665. If the APD operation is turned 'on', in step 665, a determination is made as to whether the APD operation is 'ended', as shown in step 670. If the APD operation is not 'ended', in step 670, the process loops.

If the APD operation is 'ended', in step 670, a determination is made as to whether the enable_APD_gain_update parameter is enabled, as shown in step 675. If the enable_APD_gain_update parameter is enabled, in step 675, the gain delta value $G_A$ is updated again, as shown in step 680. If the enable_APD_gain_update parameter is not enabled, in step 675, or after the gain delta value $G_A$ is updated again in step 680, or if APD is not switched on in step 665, a determination is made as to whether it is the end of the slot, as shown in step 685. If it is not the end of the slot, in step 685, the process loops to step 640. If it is the end of the slot in step 685, then the process loops back to step 610 for the next slot.

It will be understood that, if APD is supported, the wireless communication unit, integrated circuit and method of controlling an output power of a PA in a transmitter, as described above, may allow the APD system to be relatively insensitive to PA gain, whilst satisfying the transmitter specifications.

Furthermore, embodiments may modify the SVGA value and dig_attn value wherever possible to ensure that the APD system does not diverge. In addition, if a signification gain variation is detected and the PA is transmitting at a large output power, the embodiments ensure that a power backoff occurs so that APD will not diverge. As a result, the only radio requirement that may be compromised is the less important power accuracy requirement.

It will be understood that, if APD is unsupported, the wireless communication unit, integrated circuit and method of controlling an output power of a PA in a transmitter, as described above, may enable the aoc_step and the CGT to provide some form of protection against PA gain variations, where gain adjustments, such as the SVGA value and dig_attn value can be selected and updated in the normal manner.

Those skilled in the art will realize that the above recognized advantages and other advantages described herein are merely examples and are not meant to be a complete rendering of all of the advantages of the various examples described.

It will be appreciated that embodiments of the invention described herein may be comprised of one or more generic or specialized processors (or 'signal processors') such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the logic modules of the method and apparatus for performing power control described herein. Alternatively, some or all logic modules could be implemented by a state machine that has no stored program instructions, or in one or more application specific integrated circuits (ASICs), in which each logic module or some combinations of certain of the logic modules are implemented as custom logic. Of course, a combination of the two approaches could be used. Both the state machine and ASIC are considered herein as a 'signal processor' for purposes of the foregoing discussion and claim language.

Moreover, an embodiment of the invention can be implemented as a computer-readable storage element having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a Read Only Memory (ROM), a Programmable Read Only Memory (PROM), an Erasable Programmable Read Only Memory (EPROM), an Electrically Erasable Programmable Read Only Memory (EEPROM) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

In the foregoing specification, specific embodiments of the invention have been described. However, one of ordinary skill in the art appreciates that various modifications and changes can be made without departing from the scope of the invention as set forth in the claims below.

Accordingly, the specification and figures are to be regarded in an illustrative rather than a restrictive sense, and all such modifications are intended to be included within the scope of invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Moreover in this document, relational terms such as first and second, top and bottom, and the like may be used solely to distinguish one entity or action from another entity or action without necessarily requiring or implying any actual such relationship or order between such entities or actions. The terms 'comprises', 'comprising', 'has', 'having', 'includes', 'including', 'contains', 'containing' or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by 'comprises . . . a', 'has . . . a', 'includes . . . a', 'contains . . . a' does not, without more constraints, preclude the existence of additional identical elements in the process, method, article, or apparatus that comprises, has, includes, contains the element. The terms 'a' and 'an' are defined as one or more, unless explicitly stated otherwise herein.

The terms 'substantially', 'essentially', 'approximately', 'about' or any other version thereof, are defined as being close to as understood by one of ordinary skill in the art. The term 'coupled' as used herein is defined as connected, although not necessarily directly and not necessarily mechanically. A device or structure that is 'configured' in a certain way is configured in at least that way, but may also be configured in ways that are not listed.

The invention claimed is:
1. A wireless communication unit comprising:
a transmitter having a forward path comprising a power amplifier and a constant gain tracking (CGT) loop, wherein a digital attenuator of the wireless communication unit is located at a starting point for a digital domain in the transmitter and a starting point for the CGT loop; and a feedback path operably coupled to the power amplifier, wherein the feedback path comprises a coupler arranged to feed back a portion of a signal to be transmitted and a controller logic module arranged to control a power control value of the power amplifier, such that the forward path and feedback path form a closed loop power control, the controller logic module being operably coupled to both an analogue signal variable gain attenuator (SVGA) and the digital attenuator, wherein the controller logic module is arranged to determine a gain variation in the transmitter and provide attenuation to a transmit signal passing therethrough on a transmit slot by transmit slot basis by setting an attenuator level of both the SVGA and the digital attenuator in response thereto.

2. The wireless communication unit of claim 1 wherein the transmitter further comprises an adaptive predistortion (APD) loop such that the controller logic module is arranged to determine a gain variation in the APD loop.

3. The wireless communication unit of claim 2 wherein the controller logic module is arranged to determine a running estimation of the gain variation on a transmit slot-by-transmit slot basis.

4. The wireless communication unit of claim 3 wherein the running estimation of the gain variation is estimated on a transmit slot where automatic output power control is performed after power up of the transmitter and an initial gain level applied to a signal being passed to the PA based on a slot measurement.

5. The wireless communication unit of claim 3 wherein the APD loop comprises a look-up table arranged to store a running estimation of gain variation from a nominal gain value.

6. The wireless communication unit of claim 3 wherein the controller logic module is arranged to determine a running estimation of the gain variation in at least one from a group of the following points in a transmit slot:
(i) a region where the power amplifier commences transmission on an arbitrary slot at low power;
(ii) a region where a gain variation is estimated at an end of a constant gain tracking operation; and
(iii) a region where a gain variation is estimated at an end of an APD operation.

7. A method of power control in a wireless communication unit comprising a transmitter having a forward path comprising a power amplifier, and a feedback path operably coupled to the power amplifier and comprising a controller logic module arranged to control a power control value of the power amplifier, such that the forward path and feedback path form a closed loop power control, wherein the method comprises:
determining a gain variation in the transmitter, the transmitter including a constant gain tracking (CGT) loop, wherein a digital attenuator of the wireless communication unit is located at a starting point for a digital domain in the transmitter and a starting point for the CGT loop; and
providing attenuation, via both an analogue signal variable gain attenuator (SVGA) and the digital attenuator, to a transmit signal passing through the transmitter on a transmit slot by transmit slot basis by setting an attenuator level of both the SVGA and the digital attenuator in response to the determined gain variation.

8. The method of claim 7 further comprising:
storing a running estimation of gain variation from a nominal gain value in a look-up table of the APD loop comprises.

9. The method of claim 7 further comprising:
performing gain adjustments in both the digital domain and an analogue domain of the transmitter.

10. A wireless communication unit comprising:
a transmitter having a forward path comprising a power amplifier;
a feedback path operably coupled to the power amplifier, wherein the feedback path comprises a coupler arranged to feed back a portion of a signal to be transmitted and a controller logic module arranged to control a power control value of the power amplifier, such that the forward path and feedback path form a closed loop power control, wherein the transmitter further comprises an adaptive predistortion (APD) loop, and
wherein the controller logic module is arranged to determine a running estimation of the gain variation in the APD loop and provide attenuation to a transmit signal passing therethrough on a transmit slot by transmit slot basis; and
a digital attenuator such that the controller logic module provides attenuation to a transmit signal passing through the digital-domain attenuator on a slot by slot basis, and the transmitter including a constant gain tracking (CGT) loop, wherein the digital attenuator of the wireless communication unit is located at a starting point for a digital domain in the transmitter and a starting point for the CGT loop.

11. The wireless communication unit of claim 10 wherein the running estimation of the gain variation is estimated on a transmit slot where automatic output power control is performed after power up of the transmitter and an initial gain level applied to a signal being passed to the power amplifier based on a slot measurement.

12. The wireless communication unit of claim 10 wherein the APD loop comprises a look-up table arranged to store a running estimation of gain variation from a nominal gain value.

13. The wireless communication unit of claim 10 further comprising a signal variable gain attenuator, SVGA, such that the controller logic module provides attenuation to a transmit signal passing through the SVGA on a transmit slot by transmit slot basis by setting an attenuator level of the SVGA.

14. The wireless communication unit of claim 10 wherein the transmitter further comprises an adaptive output power control (AOC) loop such that the controller logic module is arranged to determine a gain variation in the AOC loop.

15. The wireless communication unit of claim 10 wherein the controller logic module is arranged to determine a running estimation of the gain variation in at least one from a group of the following points in a transmit slot:
(i) a region where the power amplifier PA commences transmission on an arbitrary slot at low power;
(ii) a region where a gain variation is estimated at an end of a constant gain tracking operation; and
(iii) a region where a gain variation is estimated at an end of an APD operation.

16. The wireless communication unit of claim 14 wherein the controller logic module is further arranged to perform gain adjustments in both the digital domain and an analogue domain of the transmitter.

17. A method of power control in a wireless communication unit comprising a transmitter having a forward path comprising a power amplifier and a feedback path operably coupled to the power amplifier and comprising a controller logic module logic module arranged to control a power control value of the power amplifier, such that the forward path and feedback path form a closed loop power control, wherein the transmitter further comprises an adaptive predistortion (APD) loop;

wherein the method comprises:

determining a running estimation of the gain variation in the APD loop; and providing attenuation to a transmit signal passing through the transmitter on a transmit slot by transmit slot basis, the transmitter including a constant gain tracking (CGT) loop, wherein the digital attenuator of the wireless communication unit is located at a starting point for a digital domain in the transmitter and a starting point for the CGT loop.

18. The wireless communication unit of claim 1 wherein the transmitter further comprises an adaptive output power control (AOC) loop such that the controller logic module is arranged to determine a gain variation in the AOC loop.

19. The method of claim 17 further comprising:

storing a running estimation of gain variation from a nominal gain value in a look-up table of the APD loop comprises.

20. The method of claim 17 further comprising:

performing gain adjustments in both the digital domain and an analogue domain of the transmitter.

\* \* \* \* \*